United States Patent [19]

Esquivel et al.

[11] Patent Number: 5,084,418
[45] Date of Patent: Jan. 28, 1992

[54] METHOD OF MAKING AN ARRAY DEVICE WITH BURIED INTERCONNECTS

[75] Inventors: Agerico L. Esquivel, Dallas; Howard L. Tigelaar, Allen; Allan T. Mitchell, Garland, all of Tex.

[73] Assignee: Texas Instruments Incorporated, Dallas, Tex.

[21] Appl. No.: 465,563

[22] Filed: Jan. 16, 1990

Related U.S. Application Data

[63] Continuation of Ser. No. 290,619, Dec. 27, 1988, abandoned.

[51] Int. Cl.$^5$ .............................................. H01L 21/70
[52] U.S. Cl. .................................. 437/203; 437/48; 437/52; 437/192; 437/200
[58] Field of Search ................ 437/38, 47, 51, 52, 437/60, 200, 228, 193, 195, 203, 235, 233, 919, 43, 48, 49; 357/23.6, 23.3

[56] References Cited

U.S. PATENT DOCUMENTS

| | | | |
|---|---|---|---|
| 4,191,603 | 3/1980 | Garbarino et al. | 427/86 |
| 4,343,676 | 8/1982 | Tarng | 156/628 |
| 4,503,598 | 3/1985 | Vora et al. | 437/203 |
| 4,520,552 | 6/1985 | Arnould et al. | 156/644 |
| 4,554,728 | 11/1985 | Shepard | 156/643 |
| 4,562,640 | 1/1986 | Widmann et al. | 148/DIG. 19 |
| 4,569,701 | 2/1986 | Oh | 437/162 |
| 4,598,461 | 7/1986 | Love | 357/23.4 |
| 4,604,150 | 8/1986 | Lin | 437/203 |
| 4,914,050 | 3/1990 | Shibat | 437/203 |

FOREIGN PATENT DOCUMENTS

| | | | |
|---|---|---|---|
| 0085988 | 9/1983 | European Pat. Off. | 437/919 |
| 0198590 | 10/1986 | European Pat. Off. | 357/23.6 |
| 0033823 | 4/1981 | Japan | 437/41 |
| 0021571 | 2/1985 | Japan | 437/44 |
| 0004357 | 1/1987 | Japan . | |
| 0039051 | 2/1987 | Japan . | |

OTHER PUBLICATIONS

Ghate, "Interconnections in VLSI", Physics Today, Oct. 1986, pp. 58–66.

*Primary Examiner*—Brian E. Hearn
*Assistant Examiner*—Tom Thomas
*Attorney, Agent, or Firm*—Douglas A. Sorensen; Richard L. Donaldson; William E. Hiller

[57] ABSTRACT

Bitlines (34) are formed by creating a diffused region (26) around the sidewalls and bottom of a trench (20). The trench (20) is filled with a conductive region (30), typically a refractory metal, refractory metal silicide.

9 Claims, 2 Drawing Sheets 5,084,418

METHOD OF MAKING AN ARRAY DEVICE WITH BURIED INTERCONNECTS

This application is a continuation of application Ser. No. 07/290,619, filed Dec. 12, 1988, now abandoned.

TECHNICAL FIELD OF THE INVENTION

This invention relates in general to integrated circuits, and more particularly to a buried bitline and method of forming the same.

BACKGROUND OF THE INVENTION

In the fabrication of semiconductor devices, it is often necessary to provide a long diffused regions such as those used as bitlines in memory devices. It is desirable that the bitline have the lowest possible sheet resistance, since decreasing resistance of the bitline will increase the speed of the device. Further, the number of contacts made to the bitline depends upon the sheet resistance; a lower sheet resistance requires less contacts. Using today's technology, one contact is made per every ten cells along a bitline.

Prior art buried bitlines are formed in a process where a pad oxide layer and a nitride layer are patterned and etched to expose the area in which a diffused region is desired. A suitable dopant is implanted into the exposed region and a subsequent anneal process diffuses the dopant. As the diffused regions are annealed, a self-aligned field oxide is grown over the diffused regions. The sheet resistance of a prior art buried bitline will, to a large degree, correspond to the width of the bitline. While a low sheet resistance is desirable, this desire must be balanced with the need for reducing the size of the devices to increase density.

One way of reducing the sheet resistance of a diffused region is to provide a metal alloy such as titanium silicide (TiSi$_2$) or tungsten silicide (WSi$_2$) along the upper surface of the bitline. While the silicide bitlines have considerably less resistance, it is still desirable to reduce their width even further.

Therefore, a need has arisen in the industry to provide a buried diffused region with low sheet resistance.

SUMMARY OF THE INVENTION

In accordance with the present invention, a bitline and method of forming the same is provided which substantially eliminates problems associated with prior bitline structures.

The bitline of the present invention comprises a doped region formed about a cavity disposed in a semiconductor substrate. A conductive material region is formed within the cavity, surrounded by the doped region. In a first embodiment, the doped region is formed using two separate ion implants. A refractory metal or refractory metal silicide is formed in trench to reduce sheet resistance.

The bitline of the present invention provides the advantage that the conductive material region greatly reduces the sheet resistance of the bitline.

BRIEF DESCRIPTION OF THE DRAWINGS

For a more complete understanding of the present invention and the advantages thereof, reference is now made to the following description now taken in conjunction with the accompanying drawings in which.

DETAILED DESCRIPTION OF THE INVENTION

The preferred embodiment of the present invention is best understood by referring to FIGS. 1-2 of the drawings, like numerals being used for like and corresponding parts of the various drawings.

Figure 1A:
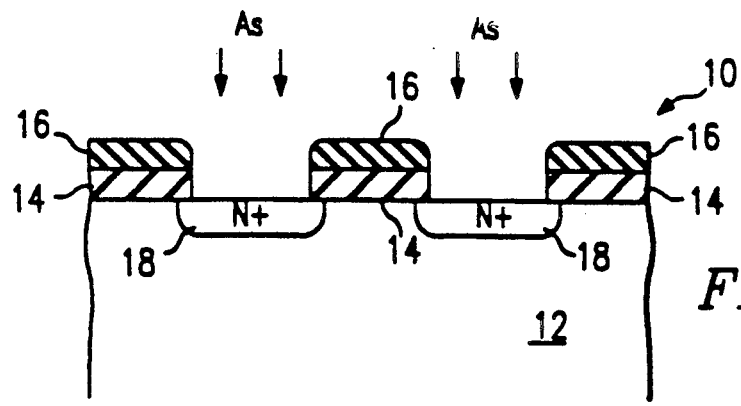
FIG. 1a illustrates cross-sectional side view of a first embodiment of the present invention after a first processing stage.

FIG. 1a illustrates a cross-sectional side view of a first embodiment of the present invention after a first processing stage. For illustration purposes, formation of the buried diffused regions are illustrated in connection with the formation of a EPROM with N type bitlines; however, the buried diffused regions may be used in any device where low sheet resistance is desirable. Further, the bitlines could be of any conductivity type with the substitution of a suitable dopant, as would be understood by one skilled in the art.

An EPROM, generally referred to by reference numeral 10, is formed on a semiconductor substrate 12. An oxide layer 14 is formed over the surface of the substrate 12 and is masked with a photoresist pattern 16. The photoresist pattern 16 exposes the substrate in areas where a diffused region is desired. The oxide is etched away, exposing the silicon thereunder, and a suitable dopant, such as arsenic is implanted into the substrate 12. The arsenic implant is annealed to form the diffused regions 18, after removing the photoresist pattern 16.

Figure 1B:
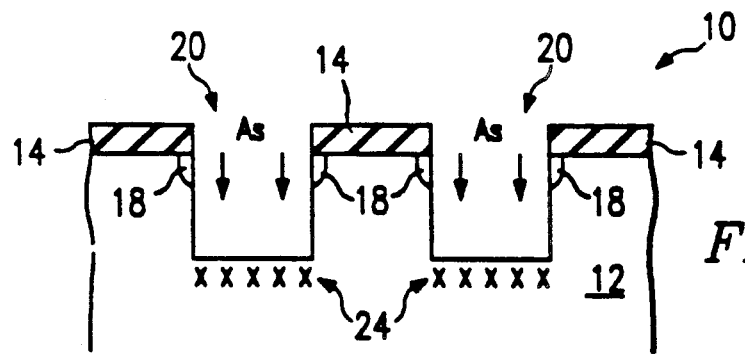
FIG. 1b illustrates cross-sectional side view of the first embodiment of the present invention after a second processing stage.

FIG. 1b illustrates a cross-sectional side view of the diffused region of the present invention after a second processing stage. After removing the photoresist pattern 16, a trench 20 is etched into the substrate 12 through the diffused regions 18. The depth of the trench will depend upon the desired sheet resistance and the conductive material used to fill the trench. Typically, a trench depth of 0.2 to 0.5 micrometers may be used. The oxide layer 14 is used as a mask and a dopant, such as arsenic, is implanted into the bottom of the trenches 20 as shown as implanted region 24.

Figure 1C:
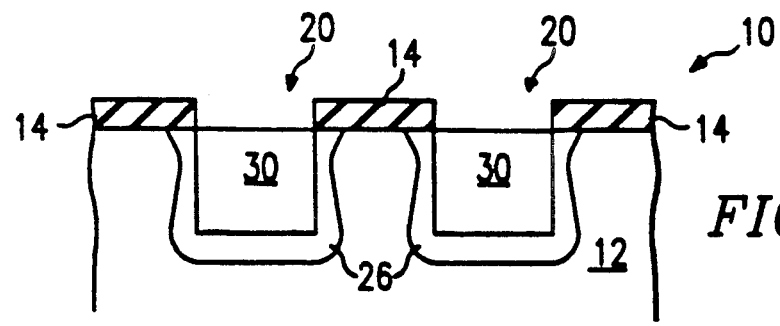
FIG. 1c illustrates cross-sectional side view of the first embodiment of the present invention after a third processing stage.

FIG. 1c illustrates a cross-sectional side view of the present invention after a third processing stage. The device is annealed to diffuse the dopants in the implanted region 24 and the upper diffused region 18. As the dopants diffuse, they will connect around the sidewalls of the trench 20 forming a continuous buried diffused region 26. The trench is substantially filled with a conductive material 30 such as a refractory metal or a refractory metal silicide. If a silicided region using titanium silicide is to be used on the buried diffused regions 26, a titanium layer is deposited on the bottom and sidewalls of the trench 20 where it is reacted with the underlying silicon to form titanium silicon ($TiSi_2$). Other techniques for providing a silicided region may be used, such as a tungsten silicide ($WSi_2$) deposition followed by an etchback.

Figure 1D:
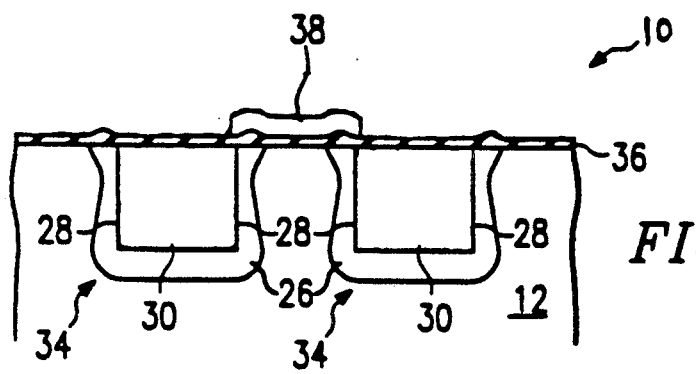
FIG. 1d illustrates cross-sectional side view of the first embodiment of the present invention in conjunction with a FAMOS transistor.

FIG. 1d illustrates a cross-sectional side view of the present invention after a fifth processing stage. The conductive material 30 and oxide layer 14 are etched back to the level of the surface of the substrate 12.

The resultant bitlines 34 may now be used in any high density transistor device. For purposes of illustration, a MOSFET transistor is illustrated. A gate oxide 36 is formed over the surface of the substrate 12 and bitlines 34 and a polysilicon layer 38 is formed thereover. Lines are etched into the first polysilicon layer 38 to form a MOSFET gate conductor.

Figure 2A:
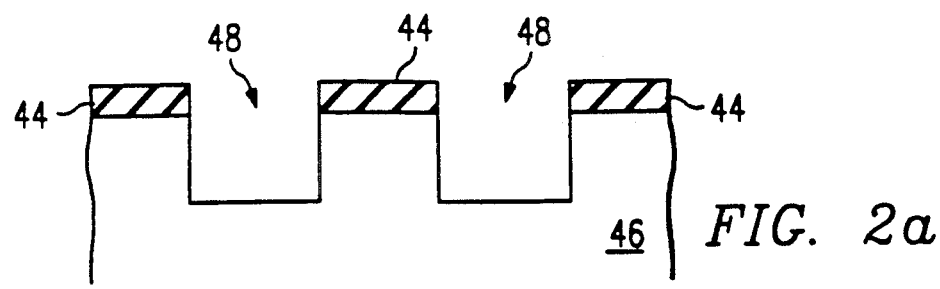
FIG. 2a illustrates cross-sectional side view of the second embodiment of the present invention wherein an alternative doping method is used after a first processing stage.
Figure 2B:
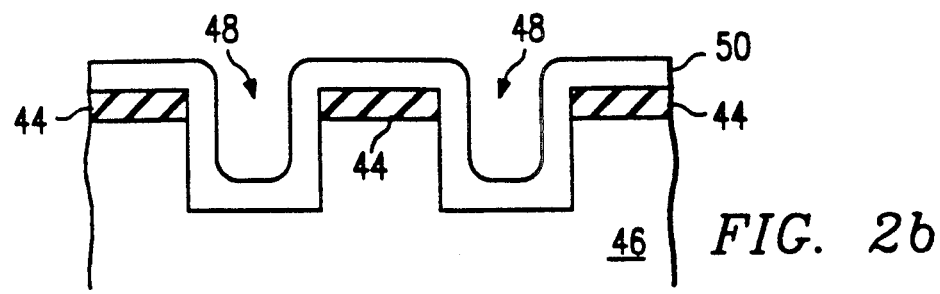
FIG. 2b illustrates cross-sectional side view of the second embodiment of the present invention after a second processing stage.
Figure 2C:
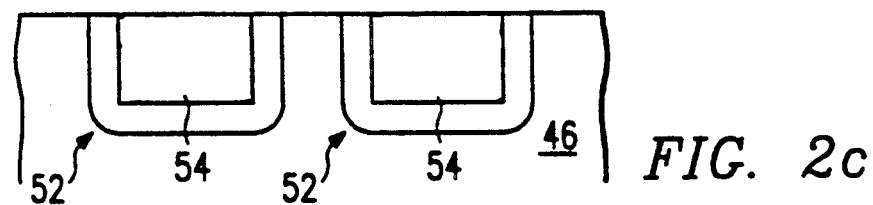
FIG. 2c illustrates cross-sectional side view of the second embodiment of the present invention after a third processing stage.

FIG. 2a-c illustrate a second embodiment of the present invention using a phosphosilicate glass (PSG) layer to dope the sidewalls and bottoms of the trenches. Referring now to FIG. 2a, an oxide layer 44 is formed over a semiconductor substrate 46. The oxide layer 44 is patterned and etched using a photoresist mask to expose portions of the substrate 46 where the diffused regions are desired. The photoresist mask is removed and trenches 48 are etched into the substrate.

FIG. 2b illustrates a cross-sectional side view of the second embodiment of the present invention after a second processing stage. A heavily doped PSG layer 50 is deposited over the surface of the substrate 46 and into the trenches 48. The PSG layer 50 is annealed, thereby driving the phosphorus into the sidewalls and bottoms of the trenches 48.

FIG. 2c illustrates a cross-sectional side view of the second embodiment of the present invention after a third processing stage. The PSG layer 50 is removed, leaving behind the buried N+ phosphorus bitlines. The structure is substantially similar to the structure of FIG. 1c. After removing the PSG layer 50, the steps outlined in FIG. 1c may be repeated to form bitlines 52 having conductive regions 54.

While several doping methods have been illustrated which allow doping of the sidewalls and bottom of the trenches, other doping methods would also be compatible with the illustrated structure. For example, it is now possible to implant the sides of a trench using an off-angle implanter.

Although the present invention has been described in detail, it should be understood that various changes, substitutions and alterations can be made herein without departing from the spirit and scope of the invention as defined by the appended claims.

What is claimed is:

1. A method for forming an array containing at least two devices on a substrate, comprising the steps of:
    forming at least one conductive lead extending between said devices, said lead formed by a process comprising the steps of:
        forming a trench in the surface of said substrate extending between said devices;
        doping the surfaces of said trench to provide a doped layer surrounding said trench of opposite conductivity type of said substrate; and
        filling said trench with a conductive material, said conductive material being in conductive contact with said doped layer.

2. A method as in claim 1 wherein said trench extends from one side of said array to another side of said array.

3. A method as in claim 1 wherein said substrate comprises crystalline silicon.

4. A method as in claim 1 wherein said lead is a bit line in a memory array.

5. A method as in claim 1 wherein said doping of the surfaces of said trench includes the steps of forming a first doped region on the surface of said substrate and forming said trench through said first doped region.

6. A method as in claim 5 wherein said doping of the surfaces of said trench includes the steps of forming a second doped region in the bottom of said trench and causing said first and second doped regions to diffuse into said substrate to form a contiguous doped region.

7. A method as in claim 1 wherein said doping of the surfaces of said trench includes the steps of depositing a dopant carrying layer on the surfaces of said trench and causing the dopant in said dopant carrying layer to diffuse into the surfaces of said trench.

8. A method as in claim 1 wherein said conductive material is a metal silicide.

9. A method as in claim 8 wherein said metal silicide is selected from the group of titanium silicide and tungsten silicide.

* * * * *